(12) United States Patent
Xiang

(10) Patent No.: US 11,094,719 B2
(45) Date of Patent: Aug. 17, 2021

(54) METHOD OF MANUFACTURING DISPLAY PANEL, DISPLAY PANEL, AND DISPLAY DEVICE

(71) Applicant: Wuhan China Star Optoelectronics Semiconductor Display Technology Co., Ltd., Hubei (CN)

(72) Inventor: Ming Xiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 23 days.

(21) Appl. No.: 16/622,712

(22) PCT Filed: Nov. 14, 2019

(86) PCT No.: PCT/CN2019/118609
§ 371 (c)(1),
(2) Date: Dec. 13, 2019

(87) PCT Pub. No.: WO2021/012529
PCT Pub. Date: Jan. 28, 2021

(65) Prior Publication Data
US 2021/0028197 A1  Jan. 28, 2021

(30) Foreign Application Priority Data

Jul. 23, 2019 (CN) .......................... 201910667191.X

(51) Int. Cl.
*H01L 27/12* (2006.01)
*H01L 51/50* (2006.01)
*H01L 27/32* (2006.01)

(52) U.S. Cl.
CPC ........ *H01L 27/1248* (2013.01); *H01L 27/127* (2013.01); *H01L 27/3246* (2013.01); *H01L 51/5012* (2013.01)

(58) Field of Classification Search
CPC ............... H01L 27/1248; H01L 27/127; H01L 27/3246; H01L 27/1255; H01L 27/3265;
(Continued)

(56) References Cited

U.S. PATENT DOCUMENTS

2014/0353631 A1\* 12/2014 Park ..................... H01L 51/5228
257/40
2016/0315133 A1\* 10/2016 Sato ..................... G09G 3/3233
(Continued)

FOREIGN PATENT DOCUMENTS

CN 107910347 A 4/2018

*Primary Examiner* — Sitaramarao S Yechuri

(57) ABSTRACT

A method of manufacturing a display panel, the display panel, and a display device are provided. The method includes forming a first via hole within a gate insulating layer and a dielectric layer of the display panel, forming an auxiliary electrode within the first via hole and on the dielectric layer, forming an inorganic insulating layer on the auxiliary electrode, and forming a cathode on the inorganic insulating layer. The cathode, the inorganic insulating layer, and the auxiliary electrode form a capacitance. The method maintains stability of a cathode voltage of the display panel, thereby improving uniformity of brightness of the display panel.

20 Claims, 3 Drawing Sheets

(58) Field of Classification Search
CPC ............. H01L 51/5012; H01L 51/5228; H01L 2227/323
See application file for complete search history.

(56) References Cited

U.S. PATENT DOCUMENTS

| | | |
|---|---|---|
| 2018/0102497 A1 | 4/2018 | Tokuda |
| 2019/0097158 A1 | 3/2019 | Sakamoto |
| 2019/0115408 A1 | 4/2019 | Fang et al. |

\* cited by examiner

METHOD OF MANUFACTURING DISPLAY PANEL, DISPLAY PANEL, AND DISPLAY DEVICE

BACKGROUND OF INVENTION

Field of Invention

The present invention relates to the field of display technology, and more particularly, to a method of manufacturing a display panel, the display panel, and a display device.

Description of Prior Art

Organic light emitting diode (OLED) devices have a self-luminous characteristic, unlike thin film transistor (TFT) liquid crystal display (LCD) devices requiring backlights, so the OLED devices have high visibility and brightness, low voltage requirements, and high power-saving efficiency. In addition, the OLED devices have light weight, thin thickness, simple structure, and low cost, so they have become one of the most promising products in the 21st century.

Vss signal of the OLED display panel is transmitted to a cathode layer of a front evaporation layer through a source/drain trace layer of a non-display region of the display panel, thereby supplying power to a pixel cathode of the display region. However, due to an influence of the source-drain trace and a front cathode voltage drop, a cathode potential of the display panel is unevenly distributed during displaying, and panel brightness is uneven.

In the prior art, the cathode can be connected to an auxiliary electrode through an inverted trapezoid, thereby improving uniformity of the cathode potential. However, it causes an inorganic encapsulation layer to have a gap in the inverted trapezoid, which reduces ability of an encapsulation film to block moisture. Meanwhile, the inverted trapezoid needs to be completed by using a negative photoresist, which increases complexity of the process and production cost.

SUMMARY OF INVENTION

In the prior art, a display panel is manufactured by a conventional method, the display panel is unevenly displayed, and the ability of the encapsulation film to block moisture is reduced, and the process is complicated and the cost is high.

In order to solve the on problems, a method of manufacturing a display panel is provided. The method of manufacturing a display panel includes:

forming a buffer layer, a source, a drain, a gate insulating layer, a gate metal layer, and a dielectric layer on the substrate sequentially;

forming a first via hole within the gate insulating layer and the dielectric layer of the display panel and forming a source/drain trace layer and an auxiliary electrode within the first via hole and on the dielectric layer;

forming a patterned inorganic insulating layer on the auxiliary electrode; and forming a planarization organic layer, an anode trace layer, a pixel defining layer, an electroluminescent layer, and a cathode on the patterned inorganic insulating layer sequentially. The cathode, the patterned inorganic insulating layer, and the auxiliary electrode form a capacitance.

In one embodiment, the step of forming a buffer layer, a source, a drain, a gate insulating layer, a gate metal layer, and a dielectric layer on the substrate sequentially includes:

forming the buffer layer on the substrate;

depositing and etching a polysilicon layer on the buffer layer to form a patterned polysilicon layer, and doping heavy ions into the patterned polysilicon layer to form the source and the drain;

depositing the gate insulating layer on the source and the drain, and the gate insulating layer completely covering the source and the drain of the display panel;

depositing the gate metal layer on the gate insulating layer, and the gate metal layer is a patterned gate metal layer; and forming the interlayer dielectric layer on the gate metal layer.

In one embodiment, the step of forming a first via hole within the gate insulating layer and the dielectric layer of the display panel and the step of forming a source/drain trace layer and an auxiliary electrode within the first via hole and on the dielectric layer include:

forming the first via hole within the gate insulating layer and the dielectric layer through etching, wherein the first via hole passes through the gate insulating layer and the dielectric layer;

forming the source/drain trace layer within the first via hole and on the dielectric layer by deposition and etching; and forming the auxiliary electrode in regions other than the source/drain trace layer on the dielectric layer.

In one embodiment, the step of forming a patterned inorganic insulating layer on the auxiliary electrode comprises forming the patterned inorganic insulating layer on the auxiliary electrode through deposition and etching. The patterned inorganic insulating layer completely covers the auxiliary electrode.

In one embodiment, the step of forming a planarization organic layer, an anode trace layer, a pixel defining layer, an electroluminescent layer, and a cathode on the patterned inorganic insulating layer sequentially includes:

forming a planarization organic layer in regions other than the patterned inorganic insulating layer on the source/drain trace layer;

forming a second via hole in the planarization organic layer, and forming an anode trace layer on the planarization organic layer and within the second via hole through deposition and etching, and the anode trace layer is connected to the source/drain trace layer through the second via hole;

forming a pixel defining layer on the anode trace layer, wherein a portion of the anode trace layer and the patterned inorganic insulating layer are exposed; and forming an electroluminescent layer and a cathode on the pixel defining layer.

In one embodiment, the step of forming a pixel defining layer on the anode trace layer and exposing a portion of the anode trace layer and the patterned inorganic insulating layer includes:

forming a patterned pixel defining layer on the anode trace layer through exposing, developing, and curing, and exposing the portion of the anode trace layer and the patterned inorganic insulating layer on the auxiliary electrode.

In one embodiment, the step of forming an electroluminescent layer and a cathode on the pixel defining layer includes:

forming an electroluminescent layer on the portion of the anode trace layer which is exposed; and forming a cathode on the pixel defining layer, and the cathode covers the pixel defining layer, the electroluminescent layer, and the patterned inorganic insulating layer, and the cathode, the patterned inorganic insulating layer, and the auxiliary electrode form a capacitance.

In one embodiment, the step of forming an electroluminescent layer on an exposed portion of the anode trace layer includes: evaporating the portion of the anode trace layer which is exposed to obtain the electroluminescent layer. The electroluminescent layer is disposed on the portion of the anode trace layer which is exposed and does not cover entire anode trace layer.

In another embodiment, a display panel includes a substrate, a buffer layer, a source, a drain, a gate insulating layer, and a gate metal layer disposed on the substrate. The display panel further includes:

a dielectric layer, and the dielectric layer is disposed on the gate insulating layer and covers the gate metal layer, and a first via hole is disposed within the dielectric layer through etching;

a source/drain trace layer disposed within the first via hole and on the dielectric layer;

an auxiliary electrode, and the auxiliary electrode is disposed on a portion region of the dielectric layer;

a patterned inorganic insulating layer disposed on the auxiliary electrode; and a planarization organic layer, an anode trace layer, a pixel defining layer, an electroluminescent layer, and a cathode disposed on the dielectric layer, and the cathode, a patterned inorganic insulating layer, and the auxiliary electrode form a capacitance.

In one embodiment, the dielectric layer comprises a silicon oxynitride layer, a silicon glass layer doped with boron and phosphorus, and a plasma enhanced tetraethoxysilane layer.

In one embodiment, the first via hole includes a first sub-via hole and a second sub-via hole, the first sub-via hole is correspondingly disposed to the source of the display panel, the second sub-via hole is correspondingly disposed opposite to the drain of the display panel, and the first via hole passes through entire gate insulating layer and the dielectric layer.

In one embodiment, an area of the patterned inorganic insulating layer is greater than or equal to an area of the auxiliary electrode.

In one embodiment, the patterned inorganic insulating layer completely covers the auxiliary electrode.

In one embodiment, an area of the auxiliary electrode and a target voltage drop satisfy following formula:

$$D=A*S;$$

D is a pressure drop of the display panel, S is the area of the auxiliary electrode, and A is a preset constant value.

The present invention also provides a display device including the on display panel.

In one embodiment, the dielectric layer includes a silicon oxynitride layer, a silicon glass layer doped with boron and phosphorus, and a plasma enhanced tetraethoxysilane layer.

In one embodiment, the first via hole includes a first sub-via hole and a second sub-via hole, the first sub-via hole is correspondingly disposed to the source of the display panel, the second sub-via hole is correspondingly disposed opposite to the drain of the display panel, and the first via hole passes through entire gate insulating layer and the dielectric layer.

In one embodiment, an area of the patterned inorganic insulating layer is greater than or equal to an area of the auxiliary electrode.

In one embodiment, the patterned inorganic insulating layer completely covers the auxiliary electrode.

In one embodiment, an area of the auxiliary electrode and a target voltage drop satisfy following formula:

$$D=A*S;$$

D is a pressure drop of the display panel, S is the area of the auxiliary electrode, and A is a preset constant value.

A method of manufacturing a display panel, the display panel, and a display device are provided. When manufacturing the display panel, a patterned inorganic insulating layer is formed on an auxiliary electrode of the display panel, so that a cathode of the display panel, a patterned inorganic insulating layer, and the auxiliary electrode form a capacitance after the display panel is completed. By maintaining stability of an auxiliary electrode voltage, stability of a cathode voltage of the display panel is maintained, and thus uniformity of brightness of the display panel is improved.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained by those skilled in the art based on drawings without any creative effort.

DETAILED DESCRIPTION OF PREFERRED EMBODIMENTS

Figure 1:
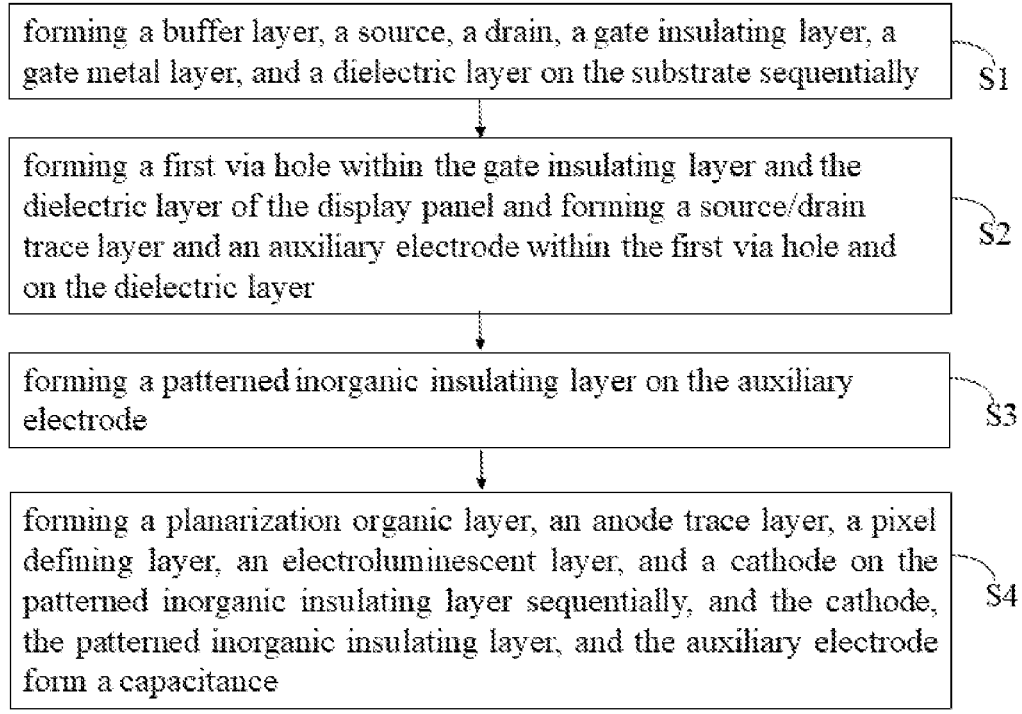
FIG. 1 is a schematic flow chart of a method of manufacturing a display panel according to one embodiment of the present invention.

The technical solutions in the embodiments of the present invention are clearly and completely described in the following with reference to the accompanying drawings in the embodiments of the present invention. It is obvious that the described embodiments are only a part of the embodiments of the present invention, but not all embodiments. All other embodiments obtained by a person skilled in the art based on the embodiments of the present invention without creative efforts are within the scope of the present invention.

In the description of the present invention, it is to be understood that the terms "center", "longitudinal," "transverse," "length," "width," "thickness," "upper," "lower," "front," "back," "left," "right," "vertical," "horizontal," "top," "bottom," "inside," and "outside" of orientational or positional relationship are based on the orientational or positional relationship shown in the drawings, and are merely for the convenience of describing the present invention and the simplified description, and do not indicate or imply that the device or component has a specific orientation or is constructed and operated in a particular orientation, so it is not to be construed as limiting the present invention. Moreover, the terms "first" and "second" are used for describing purposes only and are not to be construed as indicating or implying a relative importance or implicitly indicating the number of technical features indicated. Thus, features defining "first" or "second" may include one or more of the described features either explicitly or implicitly. In the description of the present invention, the meaning of "a plurality" is two or more, unless specifically defined otherwise.

In the present invention, the word "exemplary" is used to mean "serving as an example, instance, or illustration." Any embodiment described in the present invention as "exemplary" is not necessarily to be construed as preferred or advantageous over other embodiments. The following description is presented to enable any person skilled in the art to make and use the invention. In the following description, details are set forth for the purpose of explanation. It will be appreciated that one skilled in the art will recognize that the invention can be practiced without the specific details. In other embodiments, well-known structures and procedures are not described in detail to avoid unnecessary detail. Therefore, the present invention is not intended to be limited to the embodiments, but is in accordance with the broad scope of the principles and features disclosed herein.

A method of manufacturing a display panel, the display panel, and a display device are provided. Detailed descriptions are shown as follows.

Referring to FIG. 1, it is a schematic flow chart of a method of manufacturing a display panel according to one embodiment of the present invention. The method of manufacturing the display panel includes:

step S1, forming a buffer layer, a source, a drain, a gate insulating layer, a gate metal layer, and a dielectric layer on a substrate sequentially;

step S2, forming a first via hole within the gate insulating layer and the dielectric layer of the display panel, and forming a source/drain trace layer and an auxiliary electrode within the first via hole and on the dielectric layer;

step S3, forming a patterned inorganic insulating layer on the auxiliary electrode; and step S4, forming a planarization organic layer, an anode trace layer, a pixel defining layer, an electroluminescent layer, and a cathode on the patterned inorganic insulating layer sequentially, wherein the cathode, the patterned inorganic insulating layer, and the auxiliary electrode form a capacitance.

The method of manufacturing the display panel is provided. When manufacturing the display panel, the patterned inorganic insulating layer is formed on the auxiliary electrode of the display panel, so that the cathode of the display panel, the patterned inorganic insulating layer, and the auxiliary electrode form the capacitance after the display panel is completed. By maintaining stability of an auxiliary electrode voltage, stability of a cathode voltage of the display panel is maintained, and thus uniformity of brightness of the display panel is improved.

In the embodiment of the present invention, the step S1 includes forming the buffer layer, the source, the drain, the gate insulating layer, the gate metal layer, and the dielectric layer on the substrate sequentially, and the substrate can be made of polyimide (PI). The source and the drain formed on the buffer layer include:

forming the buffer layer on the substrate;

depositing and etching a polysilicon layer on the buffer layer to form a patterned polysilicon layer, and doping heavy ions into the patterned polysilicon layer to form the source and the drain;

depositing the gate insulating layer on the source and the drain, and the gate insulating layer completely covering the source and the drain of the display panel; and depositing the gate metal layer on the gate insulating layer, and the gate metal layer is a patterned gate metal layer.

It should be noted that, in the embodiment of the present invention, a method and a process of manufacturing the buffer layer, the source/drain, the gate insulating layer, and the gate metal layer are not limited herein, and specific reference may be made to the prior art.

In other embodiments, the gate metal layer of the display panel includes a first metal layer and a second metal layer. The gate insulating layer includes a first gate insulating layer and a second gate insulating layer. After the source/drain is formed, the first gate insulating layer is formed on the source/drain, and a first gate metal layer is formed on the first gate insulating layer. The first gate insulating layer is used to isolate the substrate from the first gate metal layer so as to prevent short circuit, and the first gate metal layer and the substrate form a thin film transistor.

After the first gate metal layer and the first gate insulating layer are formed, the second gate insulating layer is formed on the first gate metal layer, and the second gate insulating layer completely covers the first gate metal layer. A second gate metal layer is used to isolate the first gate metal layer and the second gate metal layer. Next, the second gate metal layer is formed on the second gate insulating layer. The first gate metal layer and the second gate metal layer form the capacitance, and the first gate metal layer is disposed correspondingly to the second gate metal layer.

In one embodiment of the present invention, after forming the gate metal layer, an interlayer dielectric (ILD) layer is formed on the gate metal layer. In general, the interlayer dielectric layer further includes a silicon oxynitride (SiON) layer, a silicon glass layer doped with boron and phosphorus, and a plasma-enhanced tetraethyl orthosilicate layer. The interlayer dielectric layer is mainly used to isolate the gate metal layer so as to prevent problems such as short circuit.

It should be noted that steps and a method of manufacturing the interlayer dielectric (ILD) layer can refer to the prior art, and are not limited in the embodiment of the present invention.

Figure 2:
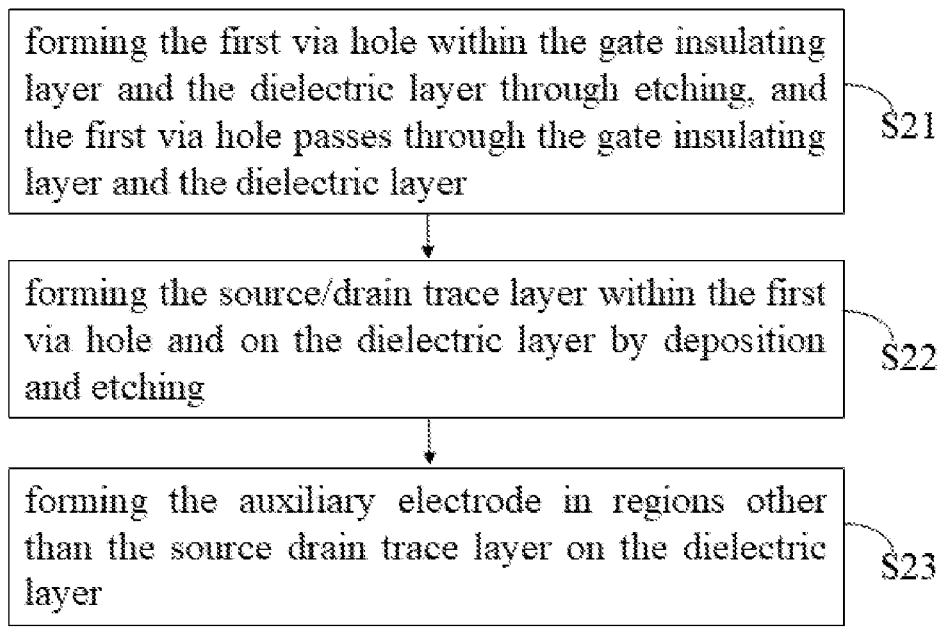
FIG. 2 is a schematic flow chart of step S2 provided by one embodiment the present invention.

Referring to FIG. 2, it is a schematic flow chart of the step S2 provided by one embodiment the present invention based on the foregoing embodiments. The step S2 of forming the first via hole within the gate insulating layer and the dielectric layer of the display panel and forming the source/drain trace layer and the auxiliary electrode within the first via hole and on the dielectric layer include:

step S21, forming the first via hole within the gate insulating layer and the dielectric layer through etching, and the first via hole passes through the gate insulating layer and the dielectric layer;

step S22, forming the source/drain trace layer within the first via hole and on the dielectric layer by deposition and etching; and step 23, forming the auxiliary electrode in regions other than the source drain trace layer on the dielectric layer.

Specifically, after the interlayer dielectric layer is formed, the first via hole is formed on the region corresponding to the source and drain of the display panel inside the gate insulating layer and the interlayer dielectric layer. The first via hole includes a first sub-via hole and a second sub-via hole.

The first sub-via hole is correspondingly disposed to the source of the display panel, the second sub-via hole is correspondingly disposed to the drain of the display panel, and the first via hole passes through an entire gate insulating layer and the interlayer dielectric layer.

After forming the first via hole, the source/drain trace layer is formed within the first via hole and on the interlayer dielectric layer by deposition and etching. The source drain trace layer is formed on a portion the interlayer dielectric layer.

After forming the source/drain trace layer, the auxiliary electrode is formed in regions other than the source/drain trace layer on the interlayer dielectric layer. In the embodiment of the present invention, the auxiliary electrodes may be one or more. Specifically, the auxiliary electrodes may be one, two, or three.

Based on the foregoing embodiments, after forming the source/drain trace layer and the auxiliary electrode, the method of manufacturing the display panel further includes: forming the patterned inorganic insulating layer on the auxiliary electrode through deposition and etching, and an area of the patterned inorganic insulating layer is greater than or equal to an area of the auxiliary electrode. Specifically, the patterned inorganic insulating layer completely covers the auxiliary electrode.

In another embodiment, after forming the source/drain trace layer and the auxiliary electrode, the method of manufacturing the display panel further includes: forming a planarization organic layer on the source/drain trace layer to expose the auxiliary electrode, and forming the patterned inorganic insulating layer on the auxiliary electrode.

Specifically, the planarization organic layer is formed on the source/drain trace layer through coating, developing, exposing, and curing, and a third via hole is formed within the planarization organic layer and passes through the entire planarization organic layer. Meanwhile, the patterned inorganic insulating layer is exposed while forming the planarization organic layer. That is, the planarization organic layer does not completely cover the entire interlayer dielectric layer.

After the patterned inorganic insulating layer is exposed, a patterned inorganic insulating layer is formed on the patterned inorganic insulating layer through deposition and etching, and an area of the patterned inorganic insulating layer is greater than or equal to an area of the auxiliary electrode. Specifically, the patterned inorganic insulating layer completely covers the auxiliary electrode.

It should be noted that in the method of manufacturing the display panel according to one embodiment of the present invention, the specific operation and method of manufacturing layers of the display panel can refer to the prior art, and are not limited in the present invention.

Figure 3:
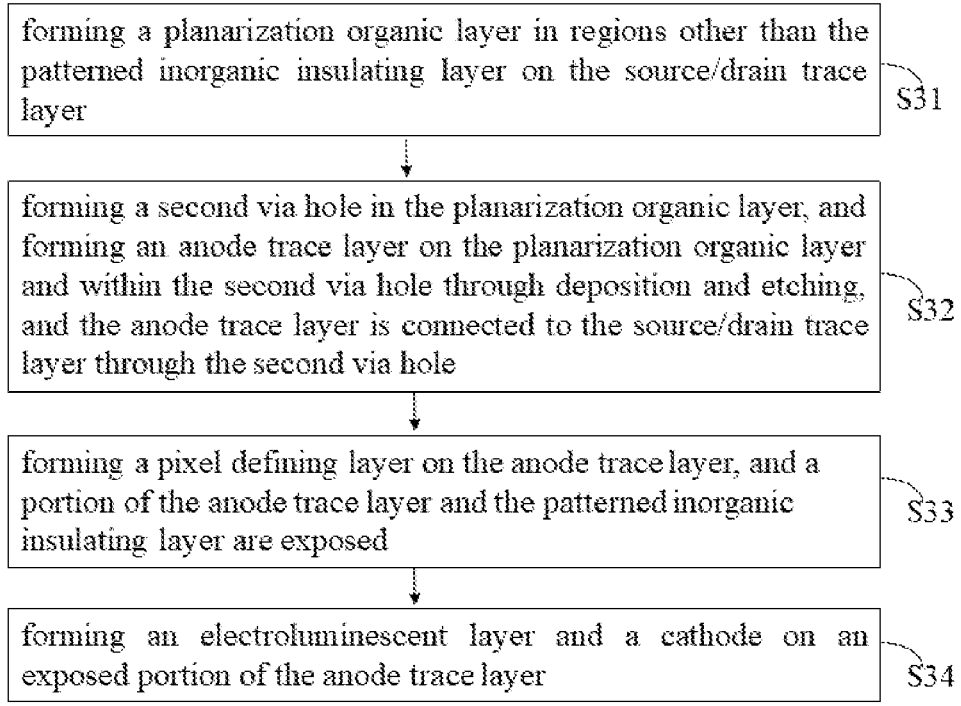
FIG. 3 is a schematic flow chart of step S4 provided by one embodiment the present invention.

Referring to FIG. 3, it is a schematic flowchart of an embodiment of the step S4 provided by the present invention based on the foregoing embodiments. The step S4 of forming the planarization organic layer, the anode trace layer, the pixel defining layer, the electroluminescent layer, and the cathode on the patterned inorganic insulating layer, and forming the capacitance by the cathode, the patterned inorganic insulating layer, and the auxiliary electrode, includes steps as follows:

S31, forming the planarization organic layer in regions other than the patterned inorganic insulating layer on the source/drain trace layer;

S32, forming a second via hole in the planarization organic layer, and forming the anode trace layer on the planarization organic layer and within the second via hole through deposition and etching, and the anode trace layer is connected to the source/drain trace layer through the second via hole;

S33, forming the pixel defining layer on the anode trace layer, and a portion of the anode trace layer and the patterned inorganic insulating layer are exposed; and S34, forming the electroluminescent layer and the cathode on an exposed portion of the anode trace layer.

Based on the foregoing embodiments, the step S34 of forming the electroluminescent layer and the cathode on the exposed portion of the anode trace layer further includes:

forming the electroluminescent layer on the portion of the anode trace layer which is exposed; and forming the cathode on the pixel defining layer, and the cathode covers the pixel defining layer; the electroluminescent layer, the patterned inorganic insulating layer, the cathode, the patterned inorganic insulating layer, and the auxiliary electrode form the capacitance.

Specifically, after forming the patterned inorganic insulating layer, the planarization organic layer is formed in regions other than the patterned inorganic insulating layer on the source/drain trace layer by coating, exposing, developing, and curing. At the same time, the second via hole is formed within the planarization organic layer and passes through the entire planarization organic layer. The patterned inorganic insulating layer is exposed while forming the planarization organic layer, that is, the planarization organic layer does not completely cover the entire interlayer dielectric layer.

After forming the second via hole, a patterned anode trace layer is formed on a portion of the planarization organic layer and within the second via hole through deposition and etching, and the anode trace layer is connected to the source/drain trace layer through the second via hole, and the anode trace layer only covers the portion of the planarization organic layer.

Based on the foregoing embodiments, after forming the anode trace layer, a patterned pixel defining layer is formed on the anode trace layer through exposing, developing, and curing, and the portion of the anode trace layer and the patterned inorganic insulating layer on the auxiliary electrode are exposed.

Based on the foregoing embodiments, when performing an evaporation process, an exposed portion of the anode trace layer is evaporated to obtain the electroluminescent layer, and the electroluminescent layer is disposed on the exposed portion of the anode trace layer and does not cover entire anode trace layer.

After forming the electroluminescent layer, the cathode is formed on the pixel defining layer, and the cathode completely covers the entire pixel defining layer and the exposed patterned inorganic insulating layer. At this time, the cathode, the patterned inorganic insulating layer, and the auxiliary electrode form the capacitance, and the cathode and the auxiliary electrode are the two ends of the capacitance. Since the stability of the voltage of the auxiliary electrode is controlled, the stability of the cathode voltage is controlled, thereby improving the uniformity of the brightness of the display panel.

In the above-mentioned embodiments, the descriptions of the various embodiments are different. For a detailed description of embodiments, reference may be made to the detailed description of other embodiments, and details are not described herein.

Figure 4:
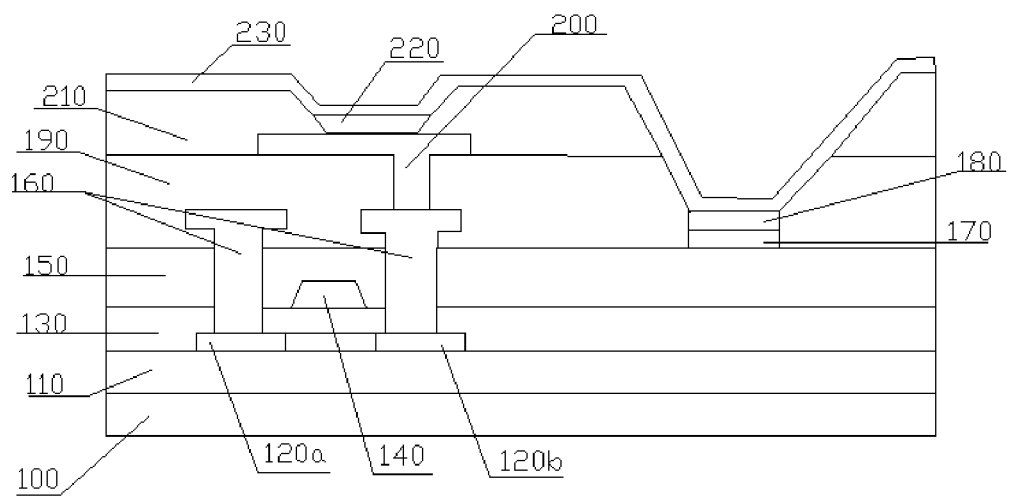
FIG. 4 is a schematic view of a display panel according to one embodiment of the present invention.

The present invention further provides a display panel. FIG. 4 is a schematic view of the display panel according to one embodiment of the present invention. The display panel includes:

a substrate 100;

a buffer layer 110 disposed on a surface of the substrate 100;

a source/drain 120 disposed on a portion region of the buffer layer 110;

a gate insulating layer 130 disposed on the buffer layer 110;

a gate metal layer 140 disposed on a portion region of the gate insulating layer 130;

a dielectric layer 150 disposed on the gate insulating layer 130 and covering the gate metal layer 140, and a first via hole 151 disposed within the dielectric layer 150 through etching;

a source/drain trace layer 160 disposed within the first via hole 151 and on the dielectric layer 150;

an auxiliary electrode 170 disposed on a portion region of the dielectric layer 150;

a patterned inorganic insulating layer 180 disposed on the auxiliary electrode 170; and a planarization organic layer 190, an anode trace layer 200, a pixel defining layer 210, an electroluminescent layer 220, and a cathode 230, which are disposed on the dielectric layer 150. The cathode 230, the patterned inorganic insulating layer 180, and the auxiliary electrode 170 form a capacitance.

Regarding the display panel provided by the present invention, when manufacturing the display panel, the patterned inorganic insulating layer is formed on the auxiliary electrode of the display panel, so that the cathode of the display panel, the patterned inorganic insulating layer, and the auxiliary electrode form the capacitance after the display panel is completed. By maintaining stability of an auxiliary electrode voltage, stability of a cathode voltage of the display panel is maintained, and thus uniformity of brightness of the display panel is improved.

In the display panel according to one embodiment of the present invention, an area of the patterned inorganic insulating layer 180 is greater than or equal to an area of the auxiliary electrode 170. Specifically, the patterned inorganic insulating layer 180 completely covers the auxiliary electrode 170.

In one embodiment of the present invention, the area of the auxiliary electrode and a voltage drop satisfy following formula: D=A*S; wherein D is a pressure drop of the display panel, S is the area of the auxiliary electrode, and A is a preset constant value.

Specifically, a region close to the Vss trace outside the display panel has a voltage drop greater than a voltage drop of another region away from the Vss trace during displaying.

Since the capacitance value of the capacitor is proportional to the area of the electrode, it is possible to dispose an auxiliary electrode having a larger area in a region where the voltage drop is greater, and an auxiliary electrode having a smaller area in a region where the voltage drop is less, thereby maintaining the stability of the cathode potential of the display panel.

Figure 5:
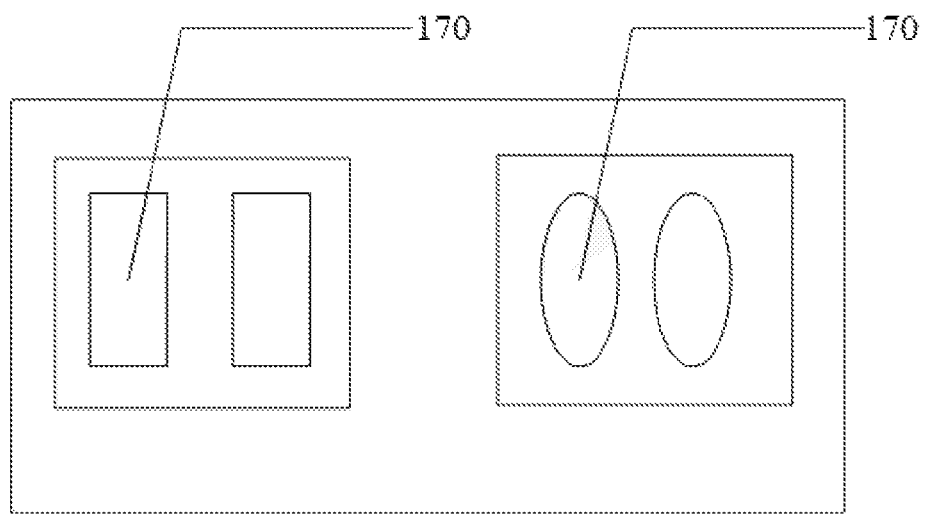
FIG. 5 is a schematic view of an auxiliary electrode according to one embodiment of the present invention.

In an embodiment of the present invention, the area of the auxiliary electrode can be altered by varying a width, length, or shape of the auxiliary electrode, thereby altering the potential at the auxiliary electrode and the cathode potential of the display panel. Referring to FIG. 5, it is a schematic view of the auxiliary electrode according to one embodiment of the present invention.

A display device is further provided by the present invention. The display device includes the above-mentioned display panel. When manufacturing the display panel, the patterned inorganic insulating layer is formed on the auxiliary electrode of the display panel, so that the cathode, the patterned inorganic insulating layer, and the auxiliary electrode of the display panel form the capacitance after the display panel is completed. By maintaining stability of an auxiliary electrode voltage, stability of a cathode voltage of the display panel is maintained, and thus uniformity of brightness of the display panel is improved.

In the specific implementation, the foregoing various units or structures may be implemented as separate entities, or may be implemented in any combination, as the same or several entities. For the specific implementation of the on various units or structures, reference may be made to the foregoing method embodiments, and details are not described herein again.

The present invention has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing a display panel, comprising:

forming a buffer layer, a source, a drain, a gate insulating layer, a gate metal layer, and a dielectric layer on a substrate sequentially;

forming a first via hole within the gate insulating layer and the dielectric layer of the display panel and forming a source/drain trace layer and an auxiliary electrode within the first via hole and on the dielectric layer;

forming a patterned inorganic insulating layer on the auxiliary electrode; and forming a planarization organic layer, an anode trace layer, a pixel defining layer, an electroluminescent layer, and a cathode on the patterned inorganic insulating layer sequentially, wherein the cathode, the patterned inorganic insulating layer, and the auxiliary electrode form a capacitance, and the cathode is in direct contact with the pixel defining layer and the planarization organic layer.

2. The method of manufacturing the display panel according to claim 1, wherein the step of forming the buffer layer, the source, the drain, the gate insulating layer, the gate metal layer, and the dielectric layer on the substrate sequentially comprises:

forming the buffer layer on the substrate;

depositing and etching a polysilicon layer on the buffer layer to form a patterned polysilicon layer, and doping heavy ions into the patterned polysilicon layer to form the source and the drain;

depositing the gate insulating layer on the source and the drain, wherein the gate insulating layer completely covering the source and the drain of the display panel;

depositing the gate metal layer on the gate insulating layer, wherein the gate metal layer is a patterned gate metal layer; and forming an interlayer dielectric layer on the gate metal layer.

3. The method of manufacturing the display panel according to claim 1, wherein the step of forming the first via hole within the gate insulating layer and the dielectric layer of the display panel and the step of forming the source/drain trace layer and the auxiliary electrode within the first via hole and on the dielectric layer comprise:

forming the first via hole within the gate insulating layer and the dielectric layer through etching, wherein the first via hole passes through the gate insulating layer and the dielectric layer;

forming the source/drain trace layer within the first via hole and on the dielectric layer by deposition and etching; and forming the auxiliary electrode in regions other than the source/drain trace layer on the dielectric layer.

4. The method of manufacturing the display panel according to claim 1, wherein the step of forming the patterned inorganic insulating layer on the auxiliary electrode comprises forming the patterned inorganic insulating layer on the auxiliary electrode through deposition and etching, wherein the patterned inorganic insulating layer completely covers the auxiliary electrode.

5. The method of manufacturing the display panel according to claim 1, wherein the step of forming the planarization organic layer, the anode trace layer, the pixel defining layer, the electroluminescent layer, and the cathode on the patterned inorganic insulating layer sequentially comprises:

forming the planarization organic layer in regions other than the patterned inorganic insulating layer on the source/drain trace layer;

forming a second via hole in the planarization organic layer, and forming the anode trace layer on the planarization organic layer and within the second via hole through deposition and etching, wherein the anode trace layer is connected to the source/drain trace layer through the second via hole;

forming the pixel defining layer on the anode trace layer, wherein a portion of the anode trace layer and the patterned inorganic insulating layer are exposed; and forming the electroluminescent layer and the cathode on the pixel defining layer.

6. The method of manufacturing the display panel according to claim 5, wherein the step of forming the pixel defining layer on the anode trace layer and exposing the portion of the anode trace layer and the patterned inorganic insulating layer comprises:

forming a patterned pixel defining layer on the anode trace layer through exposing, developing, and curing, and exposing the portion of the anode trace layer and the patterned inorganic insulating layer on the auxiliary electrode.

7. The method of manufacturing the display panel according to claim 5, wherein the step of forming the electroluminescent layer and the cathode on the pixel defining layer comprises:

forming the electroluminescent layer on the portion of the anode trace layer which is exposed; and forming the cathode on the pixel defining layer, wherein the cathode covers the pixel defining layer, the electroluminescent layer, and the patterned inorganic insulating layer; and the cathode, the patterned inorganic insulating layer, and the auxiliary electrode form the capacitance.

8. The method of manufacturing the display panel according to claim 7, wherein the step of forming the electroluminescent layer on the exposed portion of the anode trace layer comprises: evaporating the portion of the anode trace layer which is exposed to obtain the electroluminescent layer, wherein the electroluminescent layer is disposed on the portion of the anode trace layer which is exposed and does not cover entire anode trace layer.

9. A display panel, comprising:

a substrate; and a buffer layer, a source, a drain, a gate insulating layer, and a gate metal layer disposed on the substrate;

wherein the display panel further comprises:

a dielectric layer, wherein the dielectric layer is disposed on the gate insulating layer and covers the gate metal layer, and a first via hole is disposed within the dielectric layer through etching;

a source/drain trace layer disposed within the first via hole and on the dielectric layer;

an auxiliary electrode, wherein the auxiliary electrode is disposed on a portion region of the dielectric layer;

a patterned inorganic insulating layer disposed on the auxiliary electrode; and a planarization organic layer, an anode trace layer, a pixel defining layer, an electroluminescent layer, and a cathode disposed on the dielectric layer, wherein the cathode, the patterned inorganic insulating layer, and the auxiliary electrode form a capacitance, and the cathode is in direct contact with the pixel defining layer and the planarization organic layer.

10. The display panel according to claim 9, wherein the dielectric layer comprises a silicon oxynitride layer, a silicon glass layer doped with boron and phosphorus, and a plasma enhanced tetraethoxysilane layer.

11. The display panel according to claim 9, wherein the first via hole comprises a first sub-via hole and a second sub-via hole, the first sub-via hole is correspondingly disposed to the source of the display panel, the second sub-via hole is correspondingly disposed to the drain of the display panel, and the first via hole passes through entire gate insulating layer and the dielectric layer.

12. The display panel according to claim 9, wherein an area of the patterned inorganic insulating layer is greater than or equal to an area of the auxiliary electrode.

13. The display panel according to claim 12, wherein the patterned inorganic insulating layer completely covers the auxiliary electrode.

14. The display panel according to claim 13, wherein the area of the auxiliary electrode and a target voltage drop satisfy following formula:

$$D=A*S;$$

wherein D is a pressure drop of the display panel, S is the area of the auxiliary electrode, and A is a preset constant value.

15. A display device, comprising:

a display panel, wherein the display panel comprises:

a substrate; and a buffer layer, a source, a drain, a gate insulating layer, and a gate metal layer disposed on the substrate;

wherein the display panel further comprises:

a dielectric layer, wherein the dielectric layer is disposed on the gate insulating layer and covers the gate metal layer, and a first via hole is disposed within the dielectric layer through etching;

a source/drain trace layer disposed within the first via hole and on the dielectric layer;

an auxiliary electrode, wherein the auxiliary electrode is disposed on a portion region of the dielectric layer;

a patterned inorganic insulating layer disposed on the auxiliary electrode; and a planarization organic layer, an anode trace layer, a pixel defining layer, an electroluminescent layer, and a cathode disposed on the dielectric layer, wherein the cathode, the patterned inorganic insulating layer, and the auxiliary electrode form a capacitance, and the cathode is in direct contact with the pixel defining layer and the planarization organic layer.

16. The display device according to claim 15, wherein the dielectric layer comprises a silicon oxynitride layer, a silicon glass layer doped with boron and phosphorus, and a plasma enhanced tetraethoxysilane layer.

17. The display device according to claim 15, wherein the first via hole comprises a first sub-via hole and a second sub-via hole, the first sub-via hole is correspondingly disposed to the source of the display panel, the second sub-via hole is correspondingly disposed to the drain of the display panel, and the first via hole passes through entire gate insulating layer and the dielectric layer.

18. The display device according to claim 15, wherein an area of the patterned inorganic insulating layer is greater than or equal to an area of the auxiliary electrode.

19. The display device according to claim 18, wherein the patterned inorganic insulating layer completely covers the auxiliary electrode.

20. The display device according to claim 18, wherein the area of the auxiliary electrode and a target voltage drop satisfy following formula:

$$D=A*S;$$

wherein D is a pressure drop of the display panel, S is the area of the auxiliary electrode, and A is a preset constant value.

\* \* \* \* \*